(12) United States Patent
Liang et al.

(10) Patent No.: US 12,261,567 B2
(45) Date of Patent: Mar. 25, 2025

(54) DEMODULATION SIGNAL GENERATOR FOR AIR PULSE GENERATOR

(71) Applicant: xMEMS Labs, Inc., Santa Clara, CA (US)

(72) Inventors: Jemm Yue Liang, Sunnyvale, CA (US); Jing-Meng Liu, San Jose, CA (US); Jye Ren, Taipei (TW)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/396,678

(22) Filed: Dec. 26, 2023

(65) Prior Publication Data

US 2024/0128928 A1     Apr. 18, 2024

Related U.S. Application Data

(63) Continuation-in-part of application No. 18/321,757, filed on May 22, 2023, now Pat. No. 12,075,213, which is a continuation-in-part of application No. 17/553,806, filed on Dec. 17, 2021, now Pat. No. 11,758,335.

(60) Provisional application No. 63/459,170, filed on Apr. 13, 2023, provisional application No. 63/447,758, filed on Feb. 23, 2023, provisional application No.
(Continued)

(51) Int. Cl.
*H03B 5/12*     (2006.01)
*H03B 5/30*     (2006.01)

(52) U.S. Cl.
CPC ......... *H03B 5/1243* (2013.01); *H03B 5/1206* (2013.01); *H03B 5/30* (2013.01)

(58) Field of Classification Search
None
See application file for complete search history.

(56) References Cited

U.S. PATENT DOCUMENTS 4,275,363 A * 6/1981 Mishiro ............... H03L 7/12
                                                       318/116
4,646,733 A   3/1987 Stroh
(Continued)

FOREIGN PATENT DOCUMENTS

CN     101282590 A    10/2008
CN     106454666 A     2/2017
(Continued)

OTHER PUBLICATIONS

Liang, the specification, including the claims, and drawings in the U.S. Appl. No. 17/553,808, filed Dec. 17, 2021.
(Continued)

*Primary Examiner* — Walter F Briney, III
(74) *Attorney, Agent, or Firm* — Winston Hsu (57) ABSTRACT

A demodulation signal generator, coupled to an air-pulse generator comprising a flap pair, includes a resonance circuit. The resonance circuit produces a first demodulation signal and a second demodulation signal. The resonance circuit and the flap pair co-perform a resonance operation, such that the first demodulation signal and the second demodulation signal are generated via the co-performed resonance operation and have opposite polarity. The flap pair performs a differential movement to form an opening to perform a demodulation operation on a modulated air pressure variation.

25 Claims, 8 Drawing Sheets

Related U.S. Application Data

63/447,835, filed on Feb. 23, 2023, provisional application No. 63/437,371, filed on Jan. 6, 2023, provisional application No. 63/436,103, filed on Dec. 29, 2022, provisional application No. 63/435,275, filed on Dec. 25, 2022, provisional application No. 63/434,474, filed on Dec. 22, 2022, provisional application No. 63/433,740, filed on Dec. 19, 2022, provisional application No. 63/428,085, filed on Nov. 27, 2022, provisional application No. 63/354,433, filed on Jun. 22, 2022, provisional application No. 63/353,610, filed on Jun. 19, 2022, provisional application No. 63/353,588, filed on Jun. 18, 2022, provisional application No. 63/347,013, filed on May 30, 2022, provisional application No. 63/346,848, filed on May 28, 2022, provisional application No. 63/171,281, filed on Apr. 6, 2021, provisional application No. 63/143,510, filed on Jan. 29, 2021, provisional application No. 63/142,627, filed on Jan. 28, 2021, provisional application No. 63/139,188, filed on Jan. 19, 2021, provisional application No. 63/138,449, filed on Jan. 17, 2021, provisional application No. 63/137,479, filed on Jan. 14, 2021.

(56) References Cited

U.S. PATENT DOCUMENTS

| | | | |
|---|---|---|---|
| 4,942,939 | A | 7/1990 | Harrison |
| 4,973,876 | A | 11/1990 | Roberts |
| 5,109,948 | A | 5/1992 | Sandstrom |
| 5,611,406 | A | 3/1997 | Matsuzaki |
| 7,736,324 | B1 | 6/2010 | Helgeson |
| 10,425,732 | B1 | 9/2019 | Liang |
| 10,484,784 | B1 | 11/2019 | Liang |
| 10,771,893 | B1 | 9/2020 | Liang |
| 10,779,088 | B1 | 9/2020 | Liang |
| 11,172,310 | B2 | 11/2021 | Liang |
| 12,028,673 | B2 | 7/2024 | Lo |
| 2004/0024455 | A1 | 2/2004 | de Vries |
| 2005/0235988 | A1 | 10/2005 | Hansen |
| 2008/0121220 | A1 | 5/2008 | Wilder |
| 2010/0246864 | A1 | 9/2010 | Hildebrandt |
| 2010/0278368 | A1 | 11/2010 | Martin |
| 2012/0018244 | A1 | 1/2012 | Robert |
| 2012/0032892 | A1 | 2/2012 | Pasquero |
| 2012/0081337 | A1 | 4/2012 | Camp, Jr. |
| 2013/0044904 | A1 | 2/2013 | Margalit |
| 2013/0279738 | A1 | 10/2013 | Daley |
| 2014/0064036 | A1 | 3/2014 | Tseng |
| 2014/0084396 | A1 | 3/2014 | Jenkins |
| 2014/0341394 | A1 | 11/2014 | Croft, III |
| 2016/0059206 | A1 | 3/2016 | Chen |
| 2016/0261941 | A1 | 9/2016 | Brioschi |
| 2016/0356876 | A1 | 12/2016 | Lazik |
| 2016/0366521 | A1 | 12/2016 | Pinkerton, III |
| 2016/0381464 | A1 | 12/2016 | Elyada |
| 2017/0041708 | A1 | 2/2017 | Barzen |
| 2017/0064450 | A1 | 3/2017 | Kursula |
| 2017/0064457 | A1 | 3/2017 | Kupershmidt |
| 2017/0201192 | A1* | 7/2017 | Tumpold ........... H10N 30/2047 |
| 2017/0230756 | A1 | 8/2017 | Schelling |
| 2017/0255007 | A1* | 9/2017 | Inoue ................... H10N 30/802 |
| 2018/0179048 | A1 | 6/2018 | Schenk |
| 2019/0020944 | A1 | 1/2019 | Kubo |
| 2019/0116417 | A1 | 4/2019 | Liang |
| 2019/0141435 | A1 | 5/2019 | Lo |
| 2019/0238974 | A1 | 8/2019 | Hong |
| 2019/0313189 | A1 | 10/2019 | Liang |
| 2020/0059719 | A1 | 2/2020 | Liang |
| 2020/0068281 | A1 | 2/2020 | Chu |
| 2020/0087138 | A1 | 3/2020 | Schenk |
| 2020/0100033 | A1* | 3/2020 | Stoppel ................ H04R 31/003 |
| 2020/0211521 | A1 | 7/2020 | Voss |
| 2020/0213770 | A1 | 7/2020 | Duan |
| 2021/0113029 | A1 | 4/2021 | Wu |
| 2021/0144884 | A1 | 5/2021 | Mou |
| 2021/0377652 | A1 | 12/2021 | Unruh |
| 2022/0047841 | A1 | 2/2022 | Duran Vargas |
| 2022/0224999 | A1 | 7/2022 | Liang |
| 2022/0225032 | A1 | 7/2022 | Liang |
| 2023/0388695 | A1 | 11/2023 | Lo |

FOREIGN PATENT DOCUMENTS

| | | |
|---|---|---|
| CN | 106961651 A | 7/2017 |
| CN | 110839195 A | 2/2020 |
| CN | 111083603 A | 4/2020 |
| CN | 111083615 A | 4/2020 |
| CN | 108496345 B | 2/2021 |
| CN | 114390410 A | 4/2022 |
| EP | 3 860 145 A1 | 8/2021 |
| EP | 4 030 782 A1 | 7/2022 |
| EP | 4 283 607 A1 | 11/2023 |
| JP | 11-313387 A | 11/1999 |
| JP | 2011160309 A * | 8/2011 |
| JP | 2020-522178 A | 7/2020 |
| JP | 2022-16392 A | 1/2022 |
| JP | 2022-160366 A | 10/2022 |
| JP | 2022-160367 A | 10/2022 |
| JP | 2022-160368 A | 10/2022 |
| KR | 10-1901204 B1 | 9/2018 |
| KR | 10-2019-0043489 A | 4/2019 |
| KR | 10-2019-0116898 A | 10/2019 |
| KR | 10-2093804 B1 | 3/2020 |
| TW | 201902812 A | 1/2019 |
| WO | 2016/202790 A2 | 12/2016 |
| WO | 2020/230484 A1 | 11/2020 |

OTHER PUBLICATIONS

Liang, the specification, including the claims, and drawings in the U.S. Appl. No. 17/553,813, filed Dec. 17, 2021.

Tutorialspoint, "Analog Communication—DSBSC Modulation", captured by web.archive.org on Nov. 26, 2020, retrieved on Dec. 11, 2023 from the Internet URL: https://web.archive.org/web/20201126095635/https://www.tutorialspoint.com/analog_communication/analog_communication_dsbsc_modulation.htm, Nov. 26, 2020.

Zhang Hui et al., Design and Test of Air-Coupled Capacitive Micromachined Ultrasonic Transducer Array. Chinese Journal of Sensors and Actuators, www.chinatransducers.com, vol. 31, No. 5, pp. 803-808, May 2018, May 31, 2018.

* cited by examiner

DEMODULATION SIGNAL GENERATOR FOR AIR PULSE GENERATOR

CROSS REFERENCE TO RELATED APPLICATIONS

This application is a continuation-in-part of U.S. application Ser. No. 18/321,757, filed on May 22, 2023, which is further a continuation-in-part of U.S. application Ser. No. 17/553,806, filed on Dec. 17, 2021, which claims the benefit of U.S. Provisional Application No. 63/137,479, filed on Jan. 14, 2021, U.S. Provisional Application No. 63/138,449, filed on Jan. 17, 2021, U.S. Provisional Application No. 63/139,188, filed on Jan. 19, 2021, U.S. Provisional Application No. 63/142,627, filed on Jan. 28, 2021, U.S. Provisional Application No. 63/143,510, filed on Jan. 29, 2021, and U.S. Provisional Application No. 63/171,281, filed on Apr. 6, 2021. Further, U.S. application Ser. No. 18/321,757 claims the benefit of U.S. Provisional Application No. 63/346,848, filed on May 28, 2022, U.S. Provisional Application No. 63/347,013, filed on May 30, 2022, U.S. Provisional Application No. 63/353,588, filed on Jun. 18, 2022, U.S. Provisional Application No. 63/353,610, filed on Jun. 19, 2022, U.S. Provisional Application No. 63/354,433, filed on Jun. 22, 2022, U.S. Provisional Application No. 63/428,085, filed on Nov. 27, 2022, U.S. Provisional Application No. 63/433,740, filed on Dec. 19, 2022, U.S. Provisional Application No. 63/434,474, filed on Dec. 22, 2022, U.S. Provisional Application No. 63/435,275, filed on Dec. 25, 2022, U.S. Provisional Application No. 63/436,103, filed on Dec. 29, 2022, U.S. Provisional Application No. 63/447,758, filed on Feb. 23, 2023, U.S. Provisional Application No. 63/447,835, filed on Feb. 23, 2023, and U.S. Provisional Application No. 63/459,170, filed on Apr. 13, 2023. Further, this application claims the benefit of U.S. Provisional Application No. 63/437,371, filed on Jan. 6, 2023, U.S. Provisional Application No. 63/436,103, filed on Dec. 29, 2022, U.S. Provisional Application No. 63/447,758, filed on Feb. 23, 2023, and U.S. Provisional Application No. 63/459,170, filed on Apr. 13, 2023. The contents of these applications are incorporated herein by reference.

BACKGROUND OF THE INVENTION

1. Field of the Invention

The present application relates to a driving circuit or a demodulation signal generator, and more particularly, to a driving circuit or a demodulation signal generator capable of driving flap pair to perform differential movement and consuming low power.

2. Description of the Prior Art

Speaker driver and back enclosure are two major design challenges in the speaker industry. It is difficult for a conventional speaker to cover an entire audio frequency band, e.g., from 20 Hz to 20 KHz. To produce high fidelity sound with high enough sound pressure level (SPL), both the radiating/moving surface and volume/size of back enclosure for the conventional speaker are required to be sufficiently large.

Ultrasonic air pulse generator has been investigated to produce air pulses or sound overcoming the design challenges faced by conventional speakers. For ultrasonic air pulse generator comprising capacitive actuator, high power consumption would be expected when operating in ultrasonic rate, and not be welcome for portable or consumer electronic device.

Therefore, how to design a driving circuit to drive the ultrasonic air pulse generator which consumes low power is a significant objective in the field.

SUMMARY OF THE INVENTION

It is therefore a primary objective of the present application to provide a demodulation signal generator, to improve over disadvantages of the prior art.

An embodiment of the present invention discloses a demodulation signal generator coupled to an air-pulse generator. The demodulation signal generator comprising: a first node coupled to a first flap and a second node coupled to a second flap; and a resonance circuit, coupled to the first and second nodes, configured to produce a first demodulation signal on the first node and a second demodulation signal on the second node. The air-pulse generator comprises a film structure, the film structure comprises a flap pair, and the flap pair comprises the first flap and the second flap. The resonance circuit and the flap pair co-perform a resonance operation, such that the first demodulation signal and the second demodulation signal are generated via the co-performed resonance operation. The first and the second demodulation signals have opposite polarity. The first flap receives the first demodulation signal and the second flap receives the second demodulation signal, such that the flap pair performs a differential movement. The differential movement is configured to form an opening to perform a demodulation operation on a modulated air pressure variation generated by the film structure.

These and other objectives of the present invention will no doubt become obvious to those of ordinary skill in the art after reading the following detailed description of the preferred embodiment that is illustrated in the various figures and drawings.

DETAILED DESCRIPTION

In the present invention, the term "coupled to" may refer to direct or indirect connection. "Component A being coupled to component B" may indicate that component A is directly connected to component B, or component A is connected to component B via some component C.

Content of U.S. application Ser. No. 18/321,757 is incorporated herein by reference.

Figure 1:
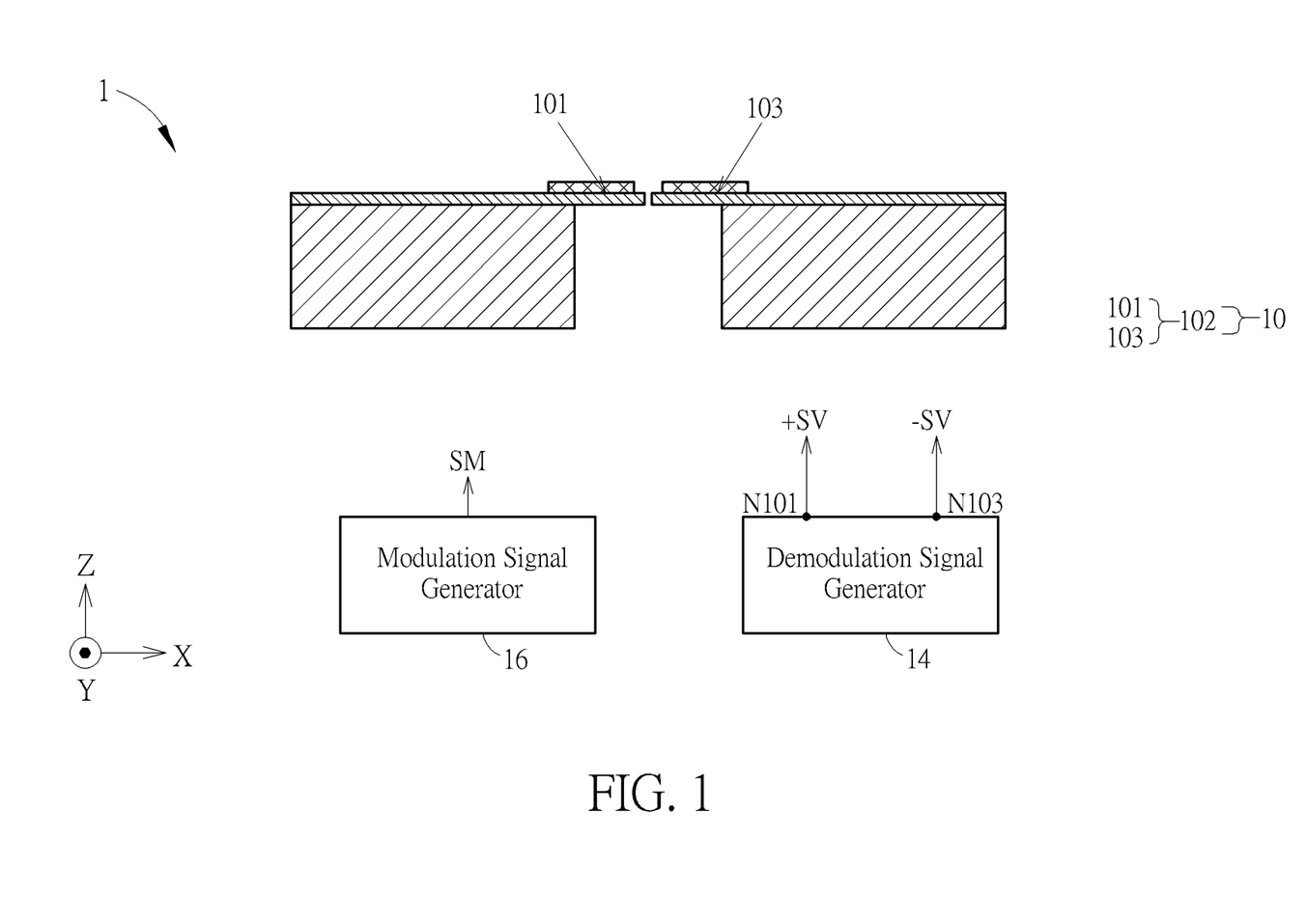
FIG. 1 illustrates a schematic diagram of an air-pulse generator according to an embodiment of the present application.

FIG. 1 illustrates an air-pulse generator (APG) 1 according to an embodiment of the present application. The APG 1, which may be used in sound reproducing or cooling application, comprises a film structure 10. The film structure 10 is configured to perform a modulation operation to produce an ultrasonic acoustic/air wave UAW according to a sound signal SS and configured to perform a demodulation operation to produce an ultrasonic pulse array UPA according to the ultrasonic acoustic/air wave UAW. The modulation operation is performed via a common-mode movement of the film structure 10 and the demodulation operation is performed via a differential-mode movement of the film structure 10. After an inherent low pass filtering effect of natural/physical environment and human hearing system, a sound corresponding to the sound signal SS is reproduced.

As taught in Ser. No. 18/321,757, the film structure 10 comprises a flap pair 102. The flap pair 102 is actuated to perform the common-mode movement to perform the modulation operation, which is to produce the ultrasonic acoustic/air wave UAW. Meanwhile, the flap pair 102 is also actuated to perform the differential-mode movement (or differential movement for brevity) to perform the demodulation operation, which is to produce the ultrasonic pulse array UPA, with a pulse rate (e.g., 192 KHz), according to the ultrasonic acoustic/air wave UAW.

The flap pair 102 comprises the first flap 101 and the second flap 103. Both the flaps 101 and 103 are coupled to a modulation signal generator 16 to receive a modulation signal SM, to be actuated to perform the common-mode movement as well as the modulation operation. On the other hand, the flaps 101 and 103 are coupled to a demodulation signal generator 14 to receive a first demodulation signal +SV and a second demodulation signal −SV, respectively. The demodulation signals +SV and −SV generally have opposite polarity with respect to a certain level, such that the flaps 101 and 103 can perform the differential-mode movement as well as the demodulation operation. Specifically, the differential-mode movement is configured to form an opening 112 (shown in FIG. 2) to perform the demodulation operation on the modulated air wave or pressure variation UAW generated by the film structure 10, or the flap pair 102.

The modulation signal SM has a modulation frequency, and the modulation frequency is the pulse rate (e.g., 192 KHz). The demodulation signal +SV/−SV has a demodulation frequency. Due to the differential-mode movement of the flap pair, the demodulation frequency may be half of the pulse rate or half of the modulation frequency (e.g., 96 KHz).

Figure 2:
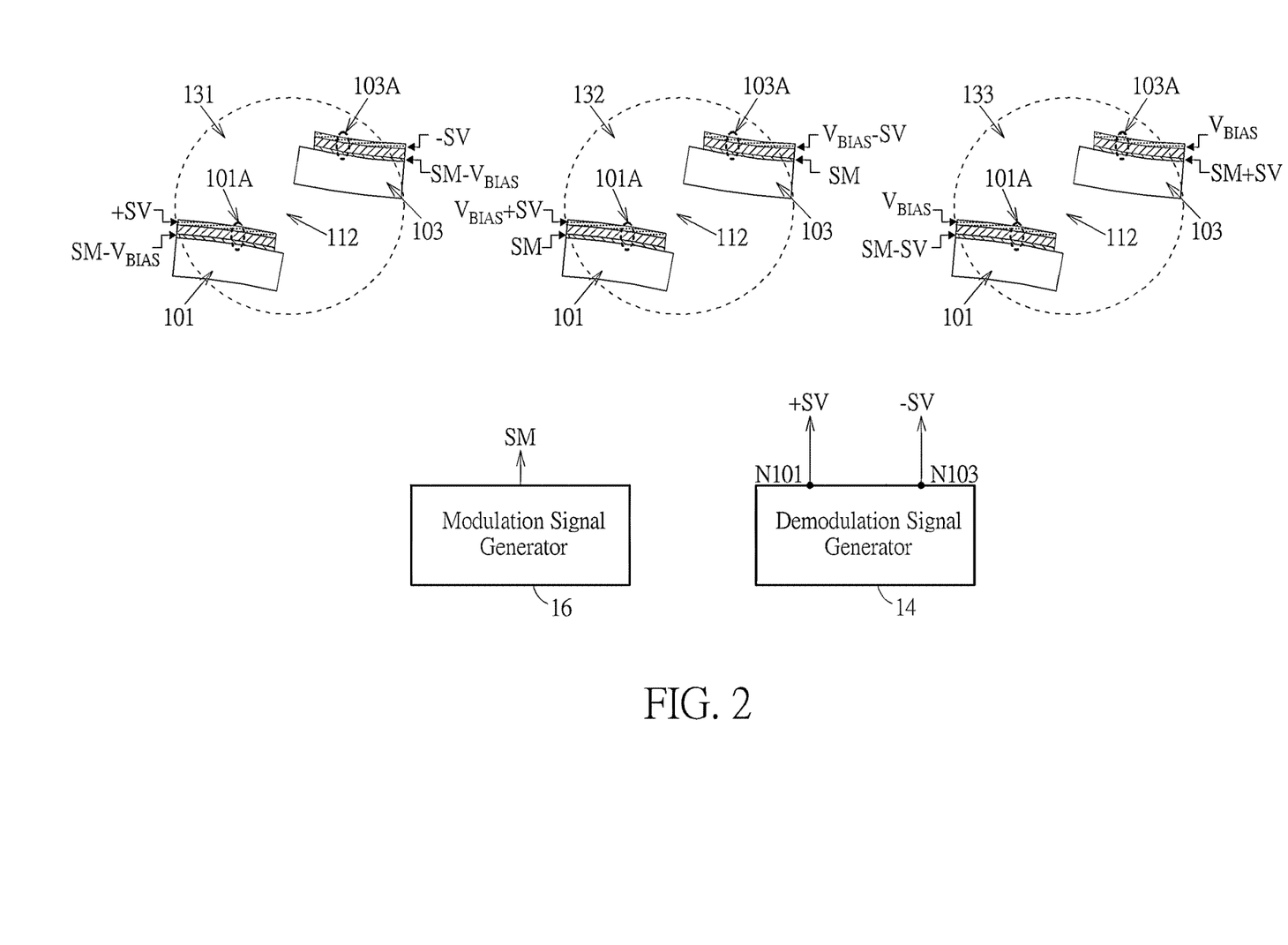
FIG. 2 illustrates wiring schemes according to embodiments of the present application.

Detail wiring schemes between the APG and the (de)modulation signal generator are illustrated in FIG. 2, where schemes 131-133 are shown. The APG 1 comprises a first actuator 101A disposed on the flap 101 and a second actuator 103A disposed on the second flap 103. The actuator 101A/103A comprises a top electrode and a bottom electrode. In an embodiment, the actuator 101A/103A also comprises a piezoelectric layer which may be made of PZT (lead zirconate titanate, which is capacitive), sandwiched between the top and bottom electrodes. In an embodiment, the demodulation signal generator may be coupled to one electrode of the actuator 101A/103A and the modulation signal generator may be coupled to another electrode of the actuator 101A/103A. For example, the demodulation signal generator may be coupled to a top electrode and the modulation signal generator may be coupled to a bottom electrode of the actuator 101A/103A. In an embodiment, the modulation and demodulation signal generators may be coupled to at least one electrode of the actuator 101A/103A.

Figure 3:
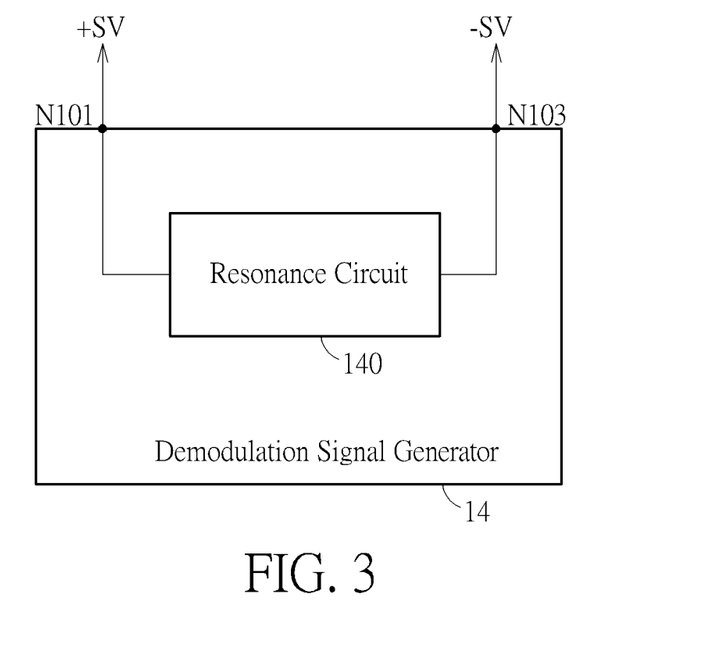
FIG. 3 illustrates a schematic diagram of a demodulation signal generator according to an embodiment of the present application.

FIG. 3 illustrates a schematic diagram of the demodulation signal generator 14 according to an embodiment of the present application. The demodulation signal generator can be viewed as a driving circuit configured to drive the flap pair to perform the differential-mode movement as well as the demodulation operation. In addition to having nodes N101 and N103 for being coupled to the flaps 101 and 103, respectively, the demodulation signal generator 14 generally comprises a resonance circuit 140. The demodulation signal generator 14 produces the demodulation signal +SV to the flap 101 via the node N101 and produces the demodulation signal −SV to the flap 103 via the node N103. The resonance circuit 140 and the flap pair 102 (the flaps 101 and 103) co-perform a resonance operation, such that the demodulation signal +SV and −SV with opposite polarity are generated.

Figure 4:
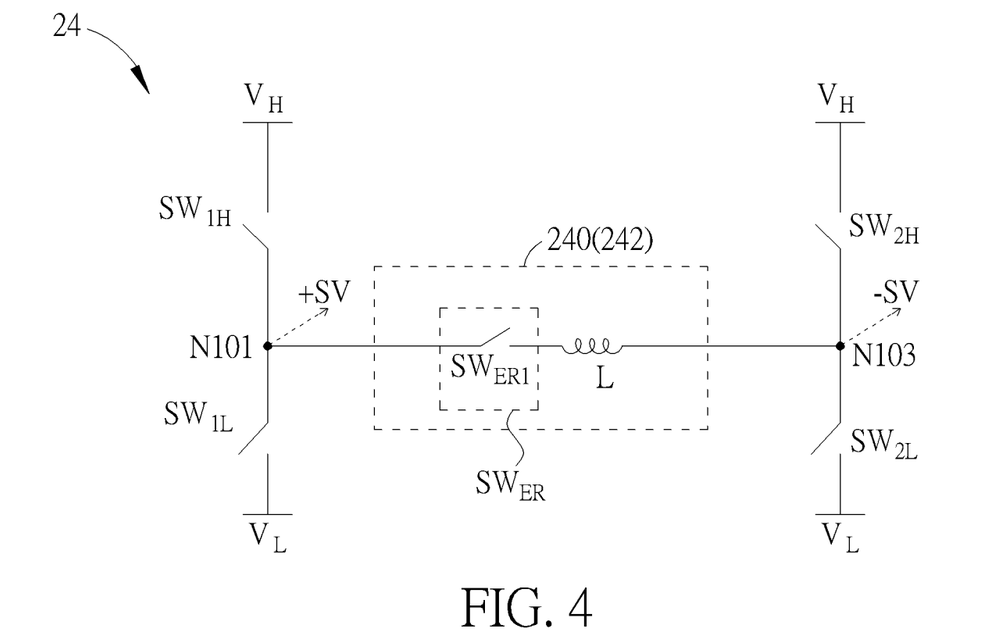
FIG. 4 illustrates a schematic diagram of a demodulation signal generator according to an embodiment of the present application.

For example, FIG. 4 illustrates a schematic diagram of a demodulation signal generator 24 according to an embodiment of the present application. The demodulation signal generator 24 comprises a resonance circuit 240, nodes N101, N103, and switches $SW_{1H}$, $SW_{1L}$, $SW_{2H}$, $SW_{2L}$. The resonance circuit 240 may be or comprise a swapping module 242. The swapping module 242 comprises an inductor L and a switching unit $SW_{ER}$. In the embodiment shown in FIG. 4, the switching unit comprises a switch $SW_{ER1}$. The swapping module 242 is coupled between the nodes N101 and N103.

Figure 5:
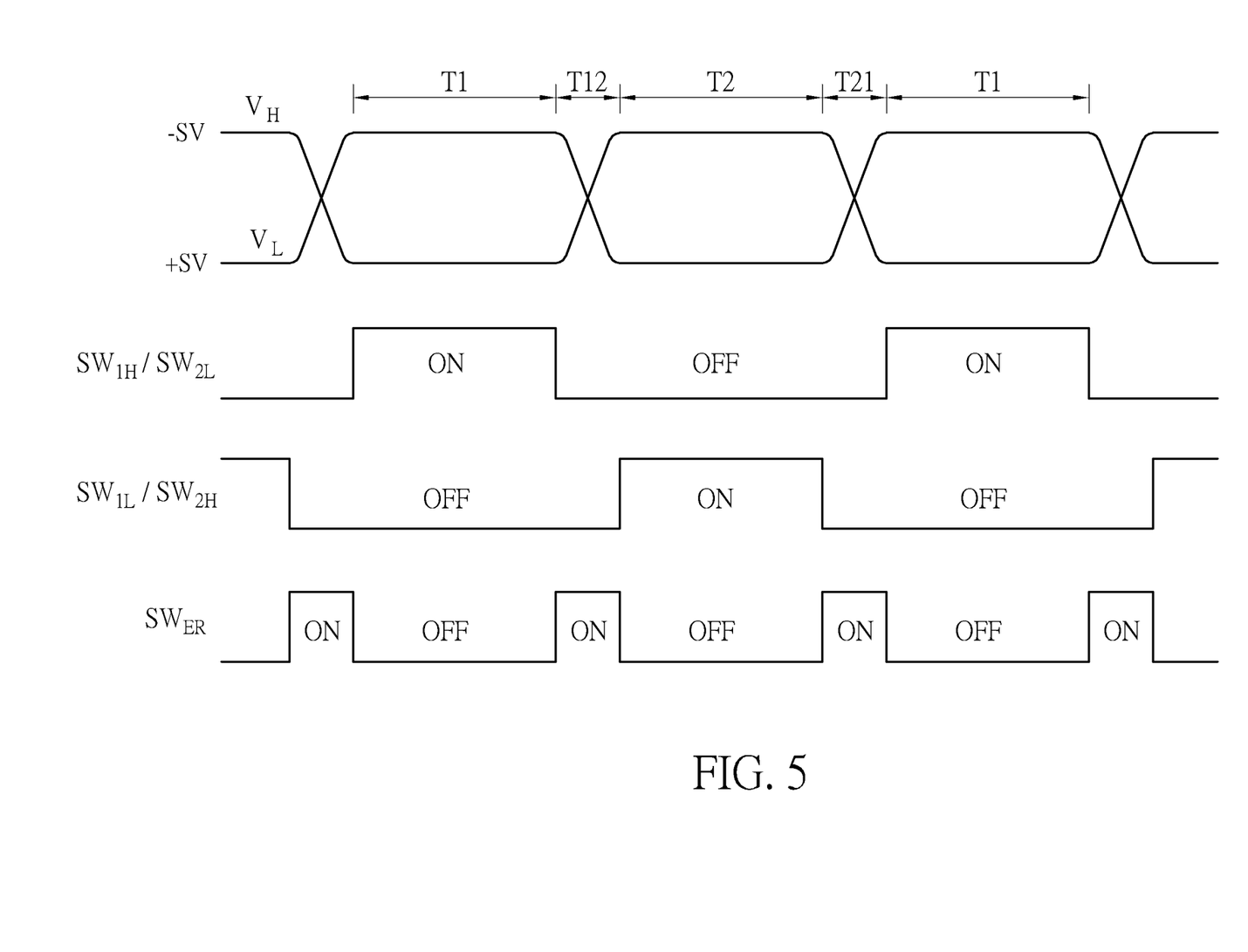
FIG. 5 illustrates a timing diagram of the demodulation signal generator of FIG. 4.

FIG. 5 illustrates a timing diagram of the demodulation signal generator 24. The swapping module 242 is conducted during a conduction period, e.g., T12 or T21 shown in FIG. 5. The demodulation signal +SV swaps from a high voltage level $V_H$ to a low voltage level $V_L$ after the conduction period T12, and the demodulation signal −SV swap from the low voltage level $V_L$ to the high voltage level $V_H$ after the conduction period T12. Similarly, the demodulation signal +SV swaps from the low voltage level $V_L$ to the high voltage level $V_H$ after the conduction period T21, and the demodulation signal −SV swap from the high voltage level $V_H$ to the low voltage level $V_L$ after the conduction period T21. Therefore, the voltage level of the first demodulation signal +SV and the voltage level of the second demodulation signal −SV swap after the conduction period T12/T21. Meanwhile, the demodulation signal +SV and the demodulation signal −SV can be viewed as having opposite polarities.

Referring to FIG. 4 and FIG. 5, the switches $SW_{1H}$ and $SW_{1L}$ are coupled to the node N101, while the switches $SW_{2H}$ and $SW_{2L}$ are coupled to the node N103. The switches $SW_{1H}$ and $SW_{2H}$ receive the high voltage $V_H$, while the switches $SW_{1L}$ and $SW_{2L}$ receive the low voltage $V_L$.

During the period T1 (before the conduction period T12), the switches $SW_{1H}$ and $SW_{2L}$ are conducted/ON and the switches $SW_{1L}$ and $SW_{2H}$ are cutoff/OFF, such that the demodulation signal +SV is at the high voltage $V_H$ and the demodulation signal −SV is at the low voltage $V_L$. No current flows through the swapping module 242 and the switching unit $SW_{ER}$ is OFF during the period T1.

During the period T2 (after the conduction period T12), the switches $SW_{1H}$ and $SW_{2L}$ are OFF and the switches $SW_{1L}$ and $SW_{2H}$ are ON, such that the demodulation signal +SV is at the low voltage $V_L$ and the demodulation signal −SV is at the high voltage $V_H$. No current flows through the swapping module 242 and the switching unit $SW_{ER}$ is OFF during the period T2.

During the conduction period T12, the switches $SW_{1H}$, $SW_{1L}$, $SW_{2H}$, $SW_{2L}$ are OFF and the switching unit $SW_{ER}$ is ON. An electric current is formed from the node N101 to the node N103, which causes the demodulation signal +SV decreases and the demodulation signal −SV increases. Therefore, electric energy stored in capacitance corresponding to the actuator 101A would be transferred to capacitance corresponding to the actuator 103A.

During the conduction period T21, similarly, the switches $SW_{1H}$, $SW_{1L}$, $SW_{2H}$, $SW_{2L}$ are OFF and the switching unit $SW_{ER}$ is ON. An electric current is formed from the node N103 to the node N101, which causes the demodulation signal +SV increases and the demodulation signal −SV decreases. Therefore, electric energy stored in capacitance corresponding to the actuator 103A would be transferred back to capacitance corresponding to the actuator 101A.

By the ON-OFF operation of the switches (meaning $SW_{1H}$, $SW_{1L}$, $SW_{2H}$, $SW_{2L}$ and $SW_{ER1}$ in FIG. 4), the demodulation signal generator 24 can generate the demodulation signals +SV and −SV with waveforms illustrated on top of FIG. 5. Note that, even the demodulation signals +SV and −SV applied to capacitive actuators 101A and 103A comprises plenty of transitions within periods T12/T21 while APG operating, power consumed by the flap pair 102 and the demodulation signal generator 24 is low due to energy is recycled back and forth between N101 and N103, with the help of the resonance circuit 240.

Applying the demodulation signals +SV and −SV to the flaps 101 and 103, the flap pair 102 can perform the differential movement.

In the present application, the flap pair performing the differential movement refers 1) during a transient state/period, one flap moves toward a first direction and the other flap moves toward a second direction opposite to the first direction; or 2) during a steady state/period, one flap is actuated to bend upward and the other flap is actuated to bend downward.

The differential movement by applying the demodulation signal generator 24 satisfies both 1) and 2) stated in the above. Specifically, during the steady state period T1 shown in FIG. 5, the flap 101 receives the demodulation signal +SV as the high voltage $V_H$ and is actuated to bend upward and the flap 103 receives the demodulation signal −SV as the low voltage $V_L$ and is actuated to bend downward. During the steady state period T2, the flap 101 receives the demodulation signal +SV as low voltage $V_L$ and is actuated to bend downward and the flap 103 receives the demodulation signal −SV as high voltage $V_H$ and is actuated to bend upward. During the transient period T12 between T1 and T2, the flap 101 moves toward a −Z direction and the flap 103 moves towards a +Z direction, which is opposite to the −Z direction.

Furthermore, during the conduction/transient/transition period T12/T21, the inductor L within the resonance circuit 240 and capacitance of the piezoelectric layer within the actuator 101A/103A would (co-)perform an LC (inductance-capacitance) resonance. The LC resonance would conduct the current from N101 to N103 during the period T12 and conduct the current from N103 to N101 during the period T21.

Figure 6:
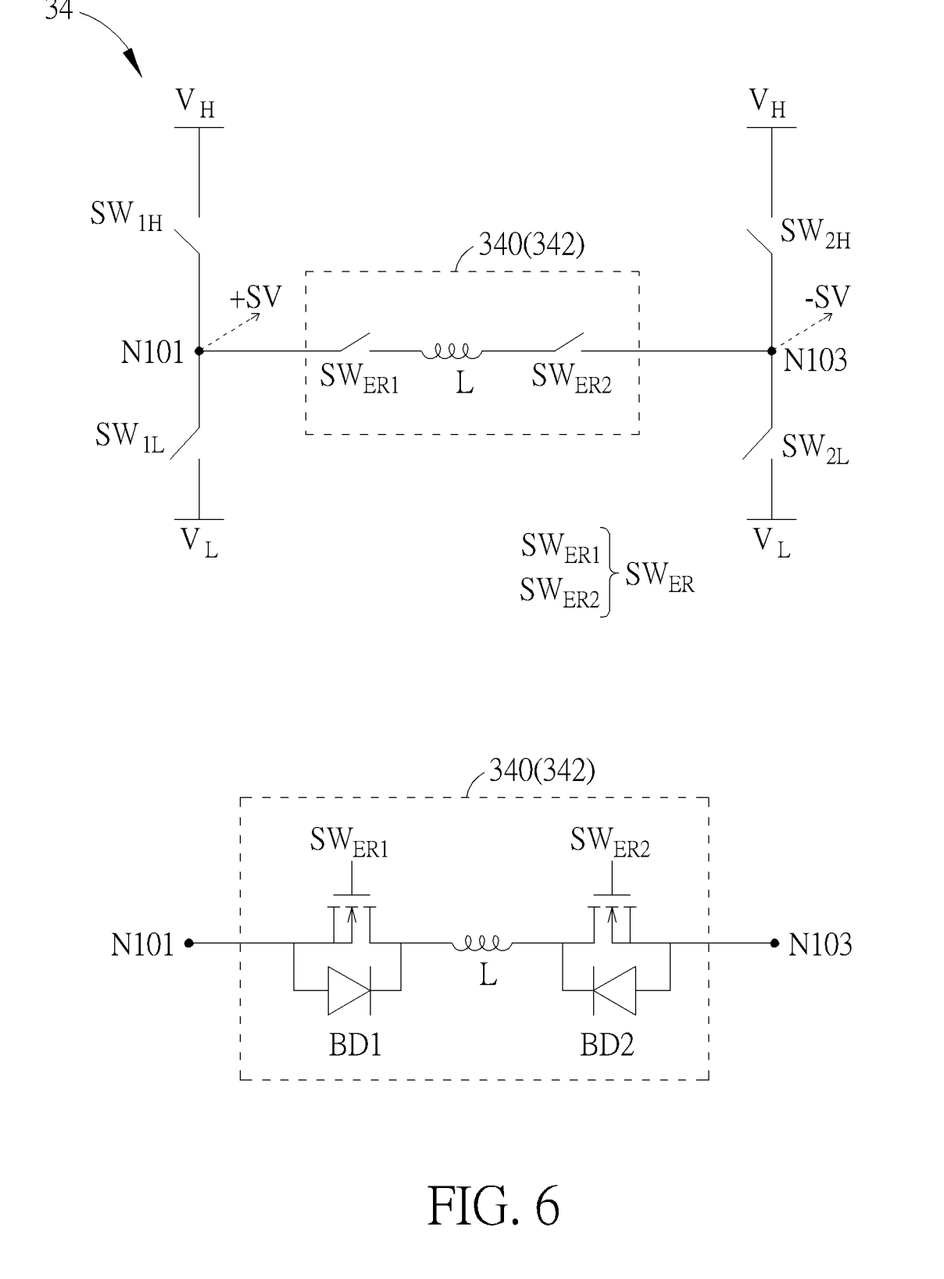
FIG. 6 illustrates a schematic diagram of a demodulation signal generator according to an embodiment of the present application.

FIG. 6 illustrates a schematic diagram of a demodulation signal generator 34 according to an embodiment of the present application. The demodulation signal generator 34 is similar to the demodulation signal generator 24, and thus same components are denoted as the same symbols. Different from the demodulation signal generator 24, the switching unit $SW_{ER}$ within a swapping module 342 or a resonance circuit 340 of the demodulation signal generator 34, further comprises a switch $SW_{ER2}$ coupled between the inductor L and the node N103, where the switches $SW_{ER1}$ and $SW_{ER2}$ form the switching unit $SW_{ER}$, and the inductor L and the switching unit $SW_{ER}$ form the swapping module 342. In the present application, the switching unit $SW_{ER}$ being ON refers both the switches $SW_{ER1}$ and $SW_{ER2}$ are ON, and the switching unit $SW_{ER}$ being OFF refers at least one of the switches $SW_{ER1}$ and $SW_{ER2}$ is OFF.

In an embodiment, the switch $SW_{ER1}$/$SW_{ER2}$ may be realized by MOSFET (Metal-Oxide-Semiconductor Field-Effect Transistor) with body diode BD1/BD2, shown in a lower portion of FIG. 6. The switch $SW_{ER1}$/$SW_{ER2}$ is configured such that the body diode BD1/BD2 is able to block current when the switch $SW_{ER1}$/$SW_{ER2}$ is OFF. In an embodiment, an anode of the body diode BD1/BD2 may be coupled to the node N101/N103 and a cathode of the body diode BD1/BD2 may be coupled to the inductor L. In this case, the body diode BD1/BD2 would prevent current flowing from inductor L to N101/N103 when the switch $SW_{ER1}$/$SW_{ER2}$ is OFF.

For the two-switches swapping module 342, it does not have to turn both switches OFF simultaneously at an end of the conduction period. Instead, given proper configuration of body diodes, turning only one switch OFF at one time and at an end of the conduction period T12/T21 is sufficient. For example, at the end of the conduction period T12, where the demodulation signal +SV decreases and the demodulation signal −SV increases therewithin (or voltage at the node N101 is less than voltage at the node N103 at the end of the conduction period T12), the switch $SW_{ER1}$ is turned OFF and the switch $SW_{ER2}$ may remain ON. In this case, the body diode BD1 with configuration shown in FIG. 6 would block current from the inductor to the node N101. Similarly, at the end of conduction period T21, the switch $SW_{ER2}$ is turned OFF and the switch $SW_{ER1}$ may remain ON.

Figure 7:
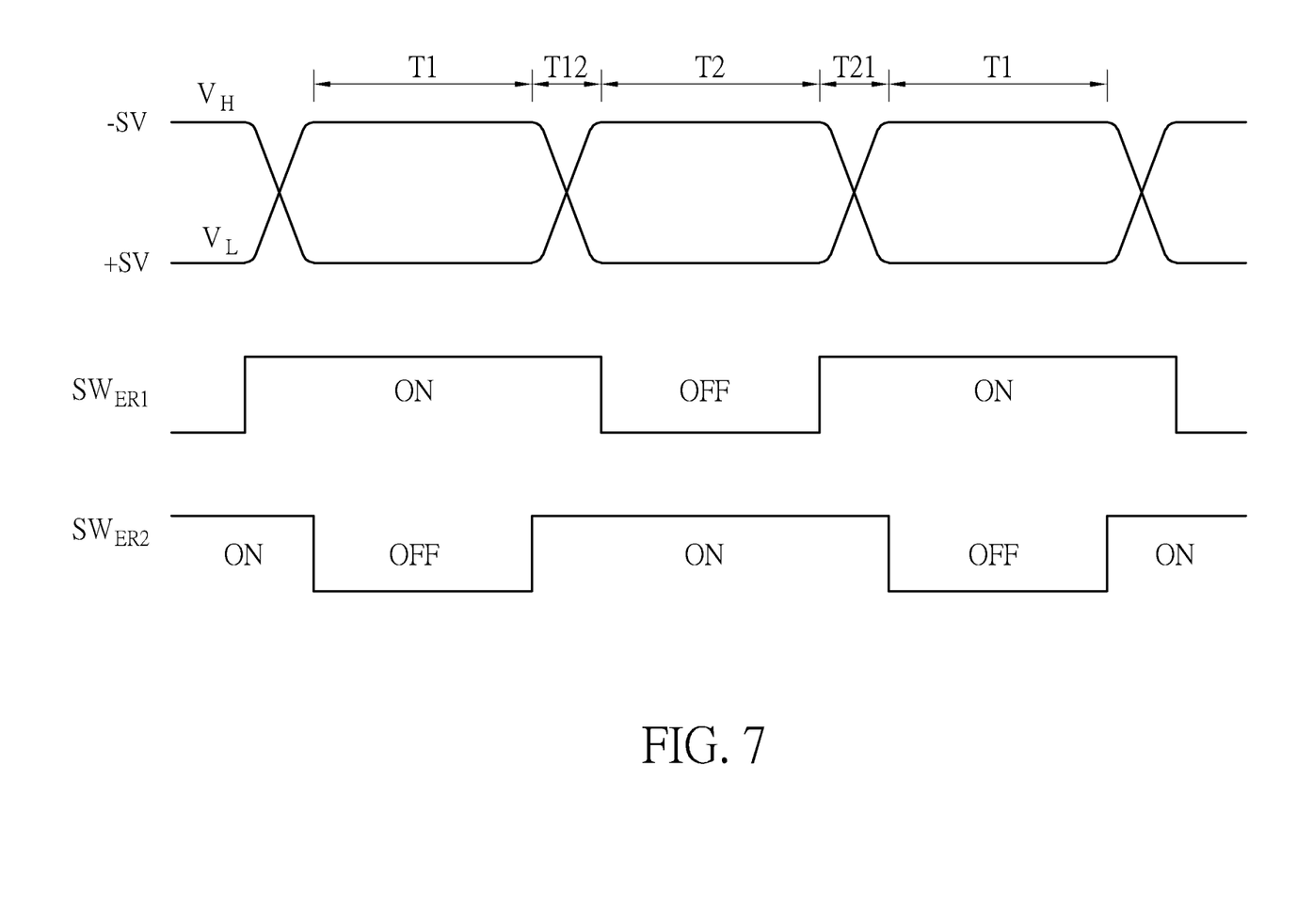
FIG. 7 illustrates a timing diagram of the demodulation signal generator of FIG. 6.

Timing of the switches $SW_{ER1}$ and $SW_{ER2}$ may be referred to FIG. 7. Turning one switch ($SW_{ER1}$ and $SW_{ER2}$) at one time would reduce toggling rate of each switch, and thereby power consumption of the switches within the swapping module 342 can be further reduced.

Note that, the switches $SW_{ER1}$ and $SW_{ER2}$ are not limited to being located on two sides of the inductor L, as shown in FIG. 6. In an embodiment, the switches $SW_{ER1}$ and $SW_{ER2}$ may be located on the same side of the inductor L (not shown), wherein the body diode BD1/2 still can block current flowing therethrough when the switch $SW_{ER1/2}$ is OFF. As long as the switches $SW_{ER1}$ and $SW_{ER2}$ are coupled between the nodes N101 and N103, it is within the scope of the present application.

In addition to the LC resonance exploited by the resonance circuit 240/340, CMOS(complementary metal oxide semiconductor)-MEMS(micro electro mechanical systems) resonance/oscillation may also be used to generate the demodulation signals ±SV.

Figure 8:
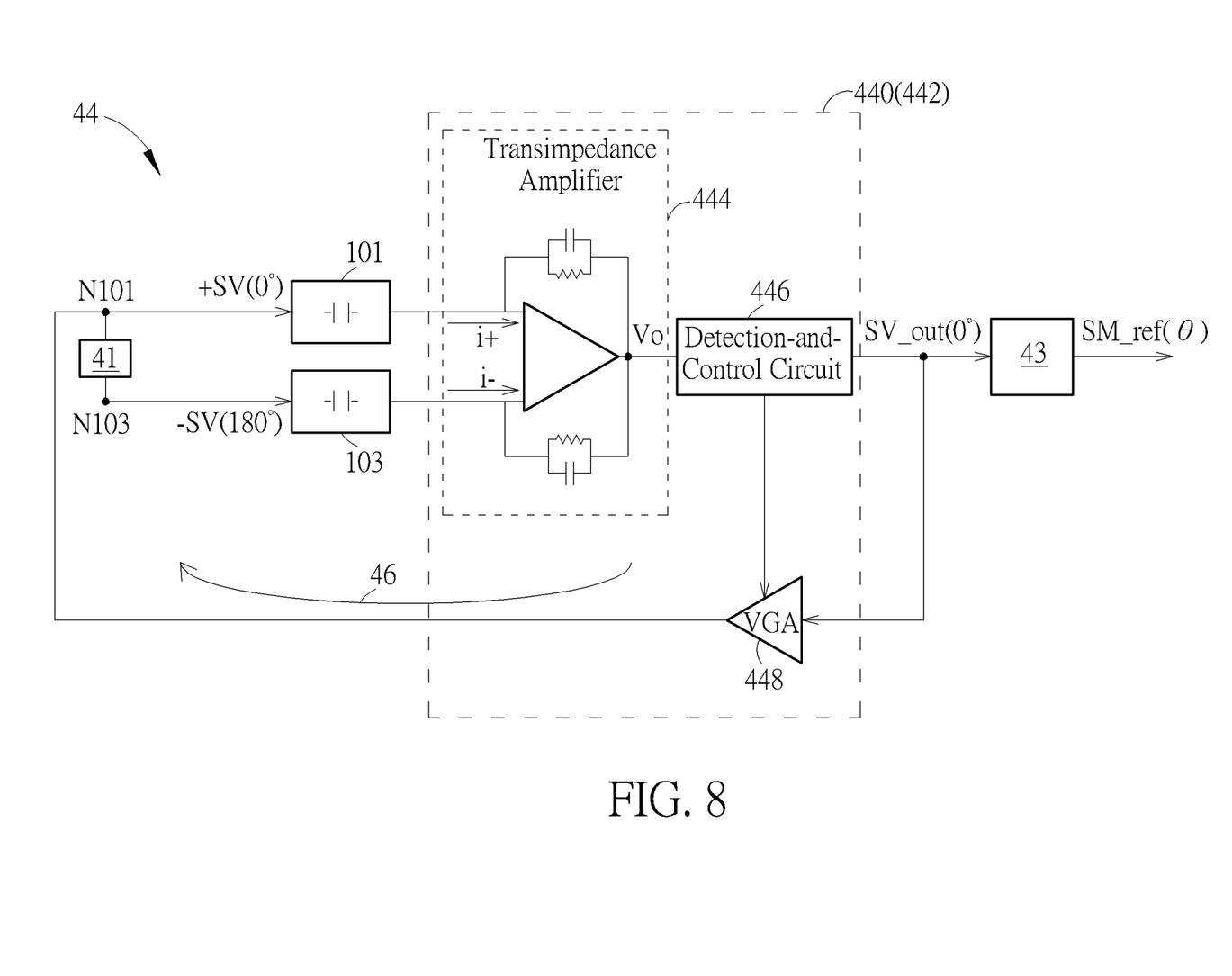
FIG. 8 illustrates a schematic diagram of a demodulation signal generator according to an embodiment of the present application.

FIG. 8 illustrates a schematic diagram of a demodulation signal generator 44 according to an embodiment of the present application. The demodulation signal generator 44 comprises a resonance circuit 440, which may be or comprise a start-up circuit 442. The resonance circuit 440 or start-up circuit 442 is coupled to the flaps 101 and 103 and exploits the resonance property of the flaps 101/103 to produce the demodulation signal ±SV, which can be viewed as co-performing a resonance operation with the flap pair 102. The start-up circuit 442 comprises a transimpedance amplifier 444, a detection-and-control circuit 446 and a variable gain amplifier (VGA) 448.

The transimpedance amplifier 444 comprises a first input terminal coupled to the flap 101 to receive a current i+ and comprises a second input terminal coupled to the flap 103 to receive a current i−. The transimpedance amplifier 444 generates an output signal Vo according to the currents i+ and i−. As FIG. 8 shows, the transimpedance amplifier 444 comprises an operational amplifier, and feedback resistors and feedback capacitors coupled between the input and output terminals.

The detection-and-control circuit 446 is coupled to the output terminal of the transimpedance amplifier 444. The detection-and-control circuit 446 is configured to perform a detection operation according to the signal Vo, where the detection operation may be an amplitude detection, a phase detection, a frequency detection operation or a combination thereof.

The detection-and-control circuit 446 controls the VGA 448, so that the start-up circuit 442, within a closed loop 46, would satisfy Barkhausen criterion, i.e., a loop gain greater than or equal to 1 and a loop phase equal to 0 or integer multiple of $2\pi$. Therefore, the flap pair 102 and the resonance circuit 440 would co-perform a CMOS-MEMS resonance/oscillation.

Figure 9:
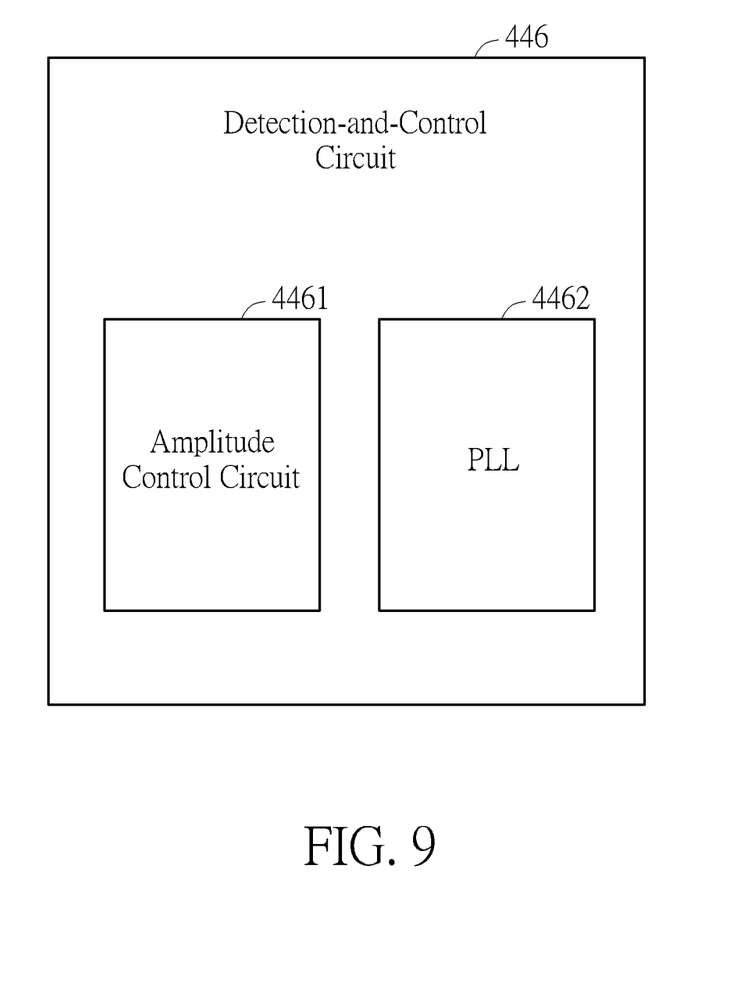
FIG. 9 illustrates a schematic diagram of a detection-and-control circuit according to an embodiment of the present application.

In an embodiment, the detection-and-control circuit 446 may comprises an amplitude control circuit 4461 (shown in FIG. 9), such that the amplitude control circuit 4461 can control the VGA 448 to form an automatic gain control (AGC) loop, in order to fulfill Barkhausen criterion.

In an embodiment, the detection-and-control circuit 446 may perform a frequency detection operation to track a resonance frequency of the flap 101/103. The frequency detection operation may be performed by applying a frequency-sweep test signal. In an embodiment, the detection-and-control circuit 446 may comprise a phase lock loop (PLL) circuit 4462 (shown in FIG. 9). The PLL circuit 4462 is configured to perform the frequency detection operation to track the resonance frequency of the flap 101/103 or the flap pair 102.

In an embodiment, a loop filter (not shown in FIG. 8) may be included to avoid unwanted oscillation.

The loop 46, formed by the flap pair 102 and the resonance circuit 440, would perform a self-sustain oscillation operation. Under the self-sustain oscillation, the displacement amount of the flap 101/103 can be amplified by Q-times. Note that, Q is the quality factor of 101 and 103's mechanical resonant mode. Therefore, the input signal amplitude of +SV and −SV can be reduced by Q-times to sustain wanted displacement, and the power will be significantly reduced by $Q^2$ times.

Note that, FIG. 8 merely illustrates an embodiment of oscillation start-up circuit. The demodulation signals +SV and −SV can be generated according to any kinds of oscillation start-up circuit or frequency detection circuit, which is not limited thereto. As long as resonance/oscillation between the flap pair and the resonance circuit is formed, it is within the scope of the present application.

Furthermore, the demodulation signal generator 44 may comprise a phase shifter 41 coupled between the flap 101 and the flap 103. The phase shifter 41 configures a phase difference between the demodulation signal +SV and the demodulation signal −SV to be 180°, such that the demodulation signal +SV and −SV would have opposite polarity. Applying the demodulation signals +SV and −SV to the flaps 101 and 103, the flap pair 102 can perform the differential movement, where the differential movement by applying the demodulation signal generator 44 satisfies 1) stated in above paragraph.

In addition, the demodulation signal generator 44 may comprise a frequency multiplier 43, coupled to the start-up circuit 442 and receives an output signal of the start-up circuit 442, denoted as SV_out. The frequency multiplier 43 is configured to double the frequency of SV_out to generate an output signal SM_ref, such that the modulation signal SM is generated according to the signal SM_ref, where a frequency of the output signal SM_ref is twice of a frequency of the output signal SV_out, such that the demodulation frequency would be half of the pulse rate or half of the modulation frequency when the modulation frequency is the pulse rate.

Note that, the resonance operation co-performed by the resonance circuit 240/340 and the flap pair utilizes electrical resonance of components therein; while the resonance operation co-performed by the resonance circuit 440 and the flap pair utilizes mechanical resonance of components therein.

One of the most advantages of demodulation signal generator utilizing resonance to generate demodulation signals ±SV is to reduce power consumption. The resonance operation is not limited to the LC or CMOS-MEMS resonance stated in the above. Demodulation signal generator with resonance circuit, exploiting any resonance to generate opposite polarity demodulation signal generator, is within the scope of the present application.

In short, the present application utilizes the resonance circuit to co-perform the resonance operation with the flap pair, so as to generate the demodulation signals ±SV with opposite polarity, where the resonance operation may be LC resonance or Barkhausen-fulfilled CMOS-MEMS resonance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A demodulation signal generator, coupled to an air-pulse generator, the demodulation signal generator comprising:
   a first node coupled to a first flap and a second node coupled to a second flap; and
   a resonance circuit, coupled to the first and second nodes, configured to produce a first demodulation signal on the first node and a second demodulation signal on the second node;
   wherein the air-pulse generator comprises a film structure, the film structure comprises a flap pair, the flap pair comprises the first flap and the second flap;
   wherein the resonance circuit and the flap pair co-perform a resonance operation, such that the first demodulation signal and the second demodulation signal are generated via the co-performed resonance operation;
   wherein the first and the second demodulation signals have opposite polarity;
   wherein the first flap receives the first demodulation signal and the second flap receives the second demodulation signal, such that the flap pair performs a differential movement;
   wherein the differential movement is configured to form a virtual valve or an opening to perform a demodulation operation on a modulated air pressure variation generated by the film structure;

wherein the virtual valve is closed corresponding to a period within a first transition time of the first demodulation signal and a second transition time of the second demodulation signal.

2. The demodulation signal generator of claim 1,
wherein the resonance circuit comprises a swapping module;
wherein the swapping module is configured to be conducted during a conduction period;
wherein a first voltage level of the first demodulation signal and a second voltage level of the second demodulation signal swap after the conduction period.

3. The demodulation signal generator of claim 2, wherein the swapping module comprises an inductor and a switching unit, coupled between the first node and the second node.

4. The demodulation signal generator of claim 3, comprising:
a first switch, a second switch, a third switch and a fourth switch;
wherein the first and second switches are coupled to the first node, and the third and fourth switches are coupled to the second node.

5. The demodulation signal generator of claim 4,
wherein during a first period before the conduction period, the first and the fourth switches are conducted and the second and the third switches are cutoff;
wherein during a second period after the conduction period, the first and the fourth switches are cutoff and the second and the third switches are conducted.

6. The demodulation signal generator of claim 5,
wherein during the first period or during the second period, the switching unit is cutoff.

7. The demodulation signal generator of claim 4,
wherein the first and the third switches receive a first voltage;
wherein the second and the fourth switches receive a second voltage.

8. The demodulation signal generator of claim 3, wherein the switching unit comprises:
a fifth switch and a sixth switch, coupled between the first node and the second node.

9. The demodulation signal generator of claim 8,
wherein during the conduction period, the fifth and the sixth switches are conducted.

10. The demodulation signal generator of claim 8,
wherein the fifth switch comprises a first body diode with a first anode coupled to the first node;
wherein the sixth switch comprises a second body diode with a second anode coupled to the second node;
wherein during the conduction period, a first voltage at the first node decreases and a second voltage at the second node increases;
wherein at an end of the conduction period, the first voltage is less than the second voltage, and the fifth switch is turned off.

11. The demodulation signal generator of claim 8,
wherein at the end of the conduction period, the sixth switch remains conducted.

12. The demodulation signal generator of claim 8,
wherein during the first period, the sixth switch is cutoff;
wherein during the second period, the fifth switch is cutoff.

13. The demodulation signal generator of claim 1,
wherein the air-pulse generator comprises a first actuator disposed on the first flap and a second actuator disposed on the second flap;
wherein the first actuator comprises a first electrode and the second actuator comprises a second electrode;
wherein the first node is coupled to the first electrode and the second node is coupled to the second electrode.

14. The demodulation signal generator of claim 13,
wherein the first actuator comprises a third electrode and the second actuator comprises a fourth electrode;
wherein the third and the fourth electrodes receive a modulation signal, such that the flap pair performs a common-mode movement to generate the modulated air pressure variation.

15. The demodulation signal generator of claim 1,
wherein the air-pulse generator produces a plurality of air pulses at a pulse rate;
wherein the plurality of air pulses is generated according to the modulated air pressure variation;
wherein a demodulation frequency of the first demodulation signal is a half of the pulse rate.

16. The demodulation signal generator of claim 1,
wherein the resonance circuit comprises a start-up circuit;
wherein an oscillation is produced by the start-up circuit and the flap pair.

17. The demodulation signal generator of claim 16,
wherein the start-up circuit comprises a transimpedance amplifier;
wherein the transimpedance amplifier comprises a first input terminal coupled to the first flap and a second input terminal coupled to the second flap;
wherein the transimpedance amplifier is configured to receive a first current corresponding to the first flap and receives a second current corresponding to the second flap;
wherein the transimpedance amplifier outputs a first output signal according to the first current and the second current;
wherein the first and second demodulation signals are generated according to the first output signal of the transimpedance amplifier.

18. The demodulation signal generator of claim 17,
wherein the start-up circuit further comprises
a detection-and-control circuit, coupled to an output terminal of the transimpedance amplifier, and configured to perform a detection operation according to the first output signal of the transimpedance amplifier; and
a variable gain amplifier (VGA), controlled by the detection-and-control circuit;
wherein the first demodulation signal is generated according to a second output signal of the variable gain amplifier.

19. The demodulation signal generator of claim 18,
wherein the detection-and-control circuit comprises an amplitude control circuit;
wherein an automatic gain control (AGC) loop is formed by the amplitude control circuit and the VGA.

20. The demodulation signal generator of claim 18,
wherein the detection-and-control circuit comprises a phase lock loop (PLL) circuit, configured to perform a frequency detection operation to track a resonance frequency of the first flap.

21. The demodulation signal generator of claim 17,
wherein the transimpedance amplifier comprises an operational amplifier.

22. The demodulation signal generator of claim 21,
wherein the transimpedance amplifier comprises a feedback resistor coupled between an input terminal and an output terminal of the operational amplifier.

23. The demodulation signal generator of claim 21, wherein the transimpedance amplifier comprises a feedback capacitor coupled between an input terminal and an output terminal of the operational amplifier.

24. The demodulation signal generator of claim 16, further comprising:
- a phase shifter, coupled to the first flap and the second flap;
- wherein the phase shifter configures a phase difference between the first demodulation signal and the second demodulation signal as 180°.

25. The demodulation signal generator of claim 16, further comprising:
- a frequency multiplier, coupled to the start-up circuit and receiving a third output signal of the start-up circuit, configured to generate a fourth output signal;
- wherein a frequency of the fourth output signal is twice of a frequency of the third output signal;
- wherein a modulation signal is generated according to the fourth output signal;
- wherein the modulation signal is configured to drive the film structure, such that the film structure generates the modulated air pressure variation.

\* \* \* \* \*